US012555743B2

(12) United States Patent
Burgess et al.

(10) Patent No.: US 12,555,743 B2
(45) Date of Patent: Feb. 17, 2026

(54) PLASMA PRODUCING APPARATUS

(71) Applicant: SPTS Technologies Limited, Newport (GB)

(72) Inventors: Stephen R Burgess, Gwent (GB); Anthony Paul Wilby, Bristol (GB); Clive L Widdicks, Bristol (GB); Ian Moncrieff, Wotton-under-Edge (GB); P Densley, Newport (GB)

(73) Assignee: SPTS Technologies Limited, Newport (GB)

( * ) Notice: Subject to any disclaimer, the term of this patent is extended or adjusted under 35 U.S.C. 154(b) by 819 days.

(21) Appl. No.: 15/016,613

(22) Filed: Feb. 5, 2016

(65) Prior Publication Data

US 2016/0240351 A1 Aug. 18, 2016

(30) Foreign Application Priority Data

Feb. 13, 2015 (GB) .................................. 1502453.2

(51) Int. Cl.
*H01J 37/32* (2006.01)
*C23C 14/35* (2006.01)
(Continued)

(52) U.S. Cl.
CPC ........ *H01J 37/3211* (2013.01); *C23C 14/358* (2013.01); *H01J 37/321* (2013.01);
(Continued)

(58) Field of Classification Search
CPC .......................... C23C 14/358; H01J 37/3411
(Continued)

(56) References Cited

U.S. PATENT DOCUMENTS 3,594,295 A * 7/1971 Meckel et al. ...... C23C 14/3471 204/192.12
6,016,131 A 1/2000 Sato et al.
(Continued)

FOREIGN PATENT DOCUMENTS

CN 1185030 A 6/1998
CN 1423833 A 6/2003
(Continued)

OTHER PUBLICATIONS

Translation to Hasegawa (JP 11-097422 as cited on IDS) published Apr. 1999.*
(Continued)

*Primary Examiner* — John J Brayton
(74) *Attorney, Agent, or Firm* — Hodgson Russ LLP

(57) ABSTRACT

A plasma producing apparatus for plasma processing a substrate Includes a chamber having an interior surface, a plasma production device for producing an inductively coupled plasma within the chamber, a substrate support for supporting the substrate during plasma processing, and a Faraday shield disposed within the chamber for shielding at least part of the interior surface from material removed from the substrate by the plasma processing. The plasma production device includes an antenna and a RF power supply for supplying RF power to the antenna with a polarity which is alternated at a frequency of less than or equal to 1000 Hz.

15 Claims, 2 Drawing Sheets

(51) Int. Cl.
*H01J 37/34* (2006.01)
*H01L 21/3065* (2006.01)

(52) U.S. Cl.
CPC .. *H01J 37/32146* (2013.01); *H01J 37/32477* (2013.01); *H01J 37/3411* (2013.01); *H01L 21/3065* (2013.01); *H01J 2237/0262* (2013.01); *H01J 2237/327* (2013.01); *H01J 2237/334* (2013.01); *H01J 2237/335* (2013.01)

(58) Field of Classification Search
USPC ............... 204/298.06; 118/723 I; 156/345.31
See application file for complete search history.

(56) References Cited

U.S. PATENT DOCUMENTS

| | | | | |
|---|---|---|---|---|
| 6,022,460 | A * | 2/2000 | O | C23C 16/507 |
| 6,281,132 | B1 | 8/2001 | Nguyen et al. | |
| 6,287,435 | B1 * | 9/2001 | Drewery | H01J 37/32477 204/298.18 |
| 6,459,066 | B1 | 10/2002 | Khater et al. | |
| 6,531,031 | B1 | 3/2003 | Becker et al. | |
| 7,811,941 | B1 * | 10/2010 | Becker | H01J 37/321 216/67 |
| 7,959,775 | B2 * | 6/2011 | Vukovic | H01J 37/321 204/298.18 |
| 2003/0042131 | A1 * | 3/2003 | Johnson | C23C 14/358 204/192.12 |
| 2003/0129835 | A1 * | 7/2003 | Kholodenko | B08B 7/0035 438/689 |
| 2004/0200576 | A1 * | 10/2004 | Liu | B08B 7/00 156/345.31 |
| 2005/0103623 | A1 * | 5/2005 | Tolmachev | C23C 14/358 204/298.06 |
| 2012/0273130 | A1 | 11/2012 | Drewery et al. | |
| 2013/0196510 | A1 | 8/2013 | George et al. | |
| 2013/0256129 | A1 | 10/2013 | Chen et al. | |

FOREIGN PATENT DOCUMENTS

| | | | | |
|---|---|---|---|---|
| CN | 102418073 | A | 4/2012 | |
| CN | 102978586 | A | 3/2013 | |
| CN | 103014745 | A | 4/2013 | |
| CN | 104342632 | A | 2/2015 | |
| EP | 0063273 | | 10/1982 | |
| EP | 0801413 | A1 * | 10/1997 | H01J 37/32623 |
| JP | H0488174 | A | 3/1992 | |
| JP | H0892748 | A | 4/1996 | |
| JP | H8335569 | A | 12/1996 | |
| JP | H08335569 | A | 12/1996 | |
| JP | H1055893 | A | 2/1998 | |
| JP | 11-97422 | | 4/1999 | |
| JP | H11186233 | A | 7/1999 | |
| JP | H1197422 | A | 9/1999 | |
| JP | 200526063 | A | 1/2005 | |
| JP | 2013535074 | A | 9/2013 | |
| JP | 2014078712 | A | 5/2014 | |
| JP | 2014239210 | A | 12/2014 | |
| TW | 200739723 | A | 10/2007 | |
| TW | 200908139 | A | 2/2009 | |
| TW | 201214522 | A | 4/2012 | |
| WO | WO2009024347 | | 2/2009 | |
| WO | WO2014187939 | A1 | 11/2014 | |

OTHER PUBLICATIONS

JPO, Translation of Reasons for Rejection for JP2016024932, Mar. 10, 2020.
JPO, Translation of Reasons for Rejection for JP2016024932, Oct. 29, 2019.
CNIPA, Office Action for CN2019120202128520, Dec. 5, 2019.
JPO, Notice of reasons for refusal for JP Application No. 2020118324, Jul. 2, 2021.

* cited by examiner

PLASMA PRODUCING APPARATUS

BACKGROUND

This invention relates to a plasma producing apparatus and to associated methods of plasma processing a substrate, with particular, but by no means exclusive, reference to sputter etching.

In the semiconductor industry, it is common practice to pre-clean a semiconductor wafer prior to a process step. For example, with semiconductor wafers having a metal layer, it is common and desirable to remove material from the wafer surface by a sputter etch process in order to ensure a high quality metal/metal interface. This is desirable to produce a repeatable low contact resistance and good adhesion. This step is normally conducted in a sputter pre-clean module which consists of a vacuum chamber surrounded by an inductive coil antenna. The substrate to be pre-cleaned is supported inside the chamber on a platen. The inductive coil antenna is wound around the outside of the chamber and one end is connecting to a RF power source through an impedance matching network. The other end of the antenna is grounded. Additionally, an RF power supply and associated impedance matching circuit is connecting to the platen in order to bias the platen. Typically, the chamber walls in the vicinity of the inductive coil antenna are made from an electrically insulating material such as quartz or ceramic so as to minimise the attenuation of the RF power coupled into the chamber.

In operation, a suitable gas (typically argon) is introduced into the chamber at a low pressure (typically around 1-10 mTorr) and RF power from the coil antenna generates an inductively coupled plasma (ICP). The platen bias acts to accelerate ions from the plasma towards the substrate. The resultant ion bombardment etches the surface of the substrate.

However, there are problems associated with a build up of material which is sputtered from a substrate and redeposited around the lid and walls of the chamber. This redeposited material can accumulate as particles which subsequently become loose. This gives rise to the potential for particles to fall onto and contaminate the substrate. Another problem is that the sputter etching of the conductive layers commonly used within the semiconductor industry, such as copper, titanium and aluminium, can lead to a build up of conductive material on the walls of the chamber. This conductive coating on the walls of the chamber has the effect of attenuating RF power coupled into the chamber by the coil antenna. The thickness of the conductive coating increases over time. The thickness of the conductive coating can increase to the point at which the sputter etch process is seriously compromised. For example, problems can be encountered with etch rate drift or a lack of etch uniformity, or problems with igniting or sustaining the plasma may be observed.

To avoid these problems, it has been necessary to perform frequent maintenance of the process module. This inevitably leads to a significant cost and tool downtime. This is highly undesirable in a production environment where throughput and efficiency are extremely important.

SUMMARY

The present invention, in at least some of its embodiments, addresses the above described problems. The present invention, in at least some of its embodiments, can extend the time between maintenance cleaning of the chamber whilst at least maintaining substrate to substrate process repeatability. Additionally, the present invention, in at least some of its embodiments, results in improved etch uniformity.

According to a first aspect of the invention there is provided a plasma producing apparatus for plasma processing a substrate comprising:

a chamber having an interior surface;

a plasma production device for producing an inductively coupled plasma within the chamber;

a substrate support for supporting the substrate during plasma processing; and a Faraday shield disposed within the chamber for shielding at least part of the interior surface from material removed from the substrate by the plasma processing;

in which the plasma production device comprises an antenna and a RF power supply for supplying RF power to the antenna with a polarity which is alternated at a frequency of less than or equal to 1000 Hz.

The RF power supply may supply RF power to the antenna with a polarity which is alternated at a frequency greater than or equal to 0.01 Hz, preferably 0.05 Hz, most preferably 0.1 Hz.

The RF power supply may supply RF power to the antenna with a polarity which is alternated at a frequency of less than or equal to 100 Hz, preferably 25 Hz, most preferably 10 Hz.

The invention extends to the alternation of the polarity in frequency ranges comprising any combination of the above mentioned upper and lower frequency limits. For example, frequency ranges at which the polarity may be alternated include the ranges 0.1-1000 Hz, 0.1-100 Hz, 0.05-5 Hz, 0.1-10 Hz and all other combinations.

The Faraday shield may be grounded. At least a portion of the chamber may also be grounded. For example, a lid of the chamber may be grounded. The grounding of both the Faraday shield and the chamber can act to reduce deposition of material onto the chamber during plasma processing.

The Faraday shield may be a cage.

The Faraday shield may comprise a plurality of apertures. The apertures may be vertically aligned slots. Typically, the antenna is horizontally disposed around the chamber, and the provision of vertically aligned slots prevents deposition of a continuous horizontal band of metal. This is advantageous, because a continuous horizontal band of metal deposited on the interior surface of the chamber causes eddy current losses which results in a reduction in etch rate.

The antenna may comprise a single turn coil. This has been found to give rise to improve results. However, the invention also extends to embodiments in which the antenna is a multiple turn coil.

The RF power supply may comprise a RF power source and a switch which causes the alternation of the polarity of the RF power supply to the antenna. Other elements, such as an impedance matching circuit, may be provided.

The apparatus may further comprise a substrate support electrical power supply for electrically biasing the substrate support. The substrate support electrical power supply may be a RF power supply for producing a RF bias on the substrate support.

The apparatus may be configured for sputter etching the substrate. Typically, an apparatus of this kind comprises a RF power supply for producing a RF bias on the substrate support.

The apparatus may be configured for pre-cleaning the substrate. In these embodiments, the apparatus may be provided as a module in a process tool.

The substrate may comprise a semiconductor material. The substrate may be a semiconductor wafer.

The substrate may comprise a semiconductor material having one or more metal layers formed thereon.

The invention is not specific to any particular plasma. Excellent results have been obtained using an argon plasma, but it is envisaged that the plasma may be produced using many other gases and gaseous mixtures.

According to a second aspect of the invention there is provided a method of plasma processing a substrate comprising:

producing a plasma in a chamber using a plasma production device comprising an antenna and a RF power supply for supplying RF power to the antenna; and plasma processing the substrate;

in which:

a Faraday shield is disposed within the chamber which shields at least part of an interior surface of the chamber from material removed from the substrate by the plasma processing; and RF power is supplied to the antenna with a polarity which is alternated at a frequency of less than or equal to 1000 Hz.

The plasma processing may be a sputter etch process. The substrate may comprise a semiconductor material having one or more metal layers formed thereon, wherein the sputter etch process removes material from the one or more metal layers.

The material removed from the substrate by the plasma processing may comprise or consist of a metal.

According to a third, broad aspect of the invention there is provided a plasma producing apparatus for plasma processing a substrate comprising:

a chamber having an interior surface;

a plasma production device for producing a inductively coupled plasma within the chamber; and a substrate support for supporting the substrate during the plasma processing;

in which the plasma production device comprises an antenna and a RF power supply for supplying RF power to the antenna with a polarity which is alternated at the frequency of less than or equal to 1000 Hz.

Whilst the invention has been described above, it extends to any inventive combination of the features set out above or in the following description, drawings or claims. For example, any feature described in relation to the first aspect of the invention is considered to be disclosed also in relation to the second and third aspects of the invention.

BRIEF DESCRIPTION OF THE DRAWINGS

Embodiments of apparatus and methods in accordance with the invention will now be described with reference to the accompanying drawings, in which.

DETAILED DESCRIPTION OF EMBODIMENTS

Figure 1:
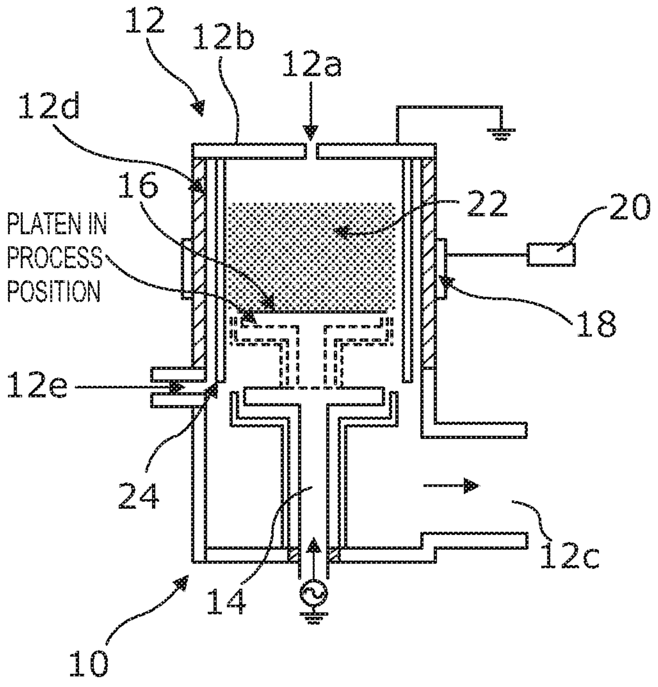
FIG. 1 is a cross sectional view of an apparatus of the invention.

FIG. 1 shows a plasma processing apparatus, depicted generally at 10, which comprises a chamber 12 and a platen 14 which is positioned in the chamber 12 and which acts as a support for a wafer 16 to be processed. The solid lines show the platen 14 in a lowered position prior to receiving the wafer, and the dotted lines show the platen 14 it its raised, in-use position. The chamber 12 comprises a gas inlet 12*a* positioned in a lid portion 12*b* and a pumping port 12*c*. Gases are removed from the chamber 12 via the pumping port 12*c* which is connected to a suitable pumping arrangement. A turbomolecular pump may be used to pump the chamber. The chamber 12 further comprises a wall portion 12*d* which is formed from an electrically insulating material such as quartz or ceramic and a wafer loading slot 12*e*. An inductive coil antenna 18 is circumferentially disposed around the wall region 12*d* of the chamber 12. The inductive coil antenna 18 is supplied with RF power by a RF power supply and impedance matching unit 20. A plasma 22 is created in the chamber 12 by inductively coupling RF power into the chamber 12 from the inductive coil antenna 18. The electrically insulating material of the chamber wall 12*d* minimises the attenuation of the RF power coupled into the chamber 12.

Figure 2:
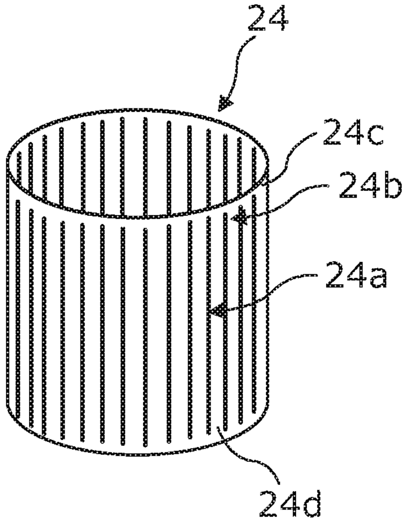
FIG. 2 is a perspective view of a Faraday shield.

The apparatus 10 further comprises a Faraday shield 24 which is positioned within the chamber 12. The Faraday shield 24 is shown in more detail in FIG. 2. In the embodiment shown in FIGS. 1 and 2, the Faraday shield is a metal cage comprising a plurality of spaced apart metal bars 24*a* which define vertically aligned slots 24*b*. The Faraday shield further comprises upper and lower rim portions 24*c*, 24*d*, respectively. Conveniently, the upper rim portion 24*c* may be attached to the lid portion 12*b* to permit the Faraday shield 24 to be grounded to the lid portion 12*b*. The shape of the Faraday shield generally conforms to the shape of the wall portion 12*d* of the chamber 12. In the embodiment shown in FIGS. 1 and 2, the Faraday shield 24 is of a cylindrical shape which is sized, so that, when positioned in the chamber 12, the Faraday shield 24 is spaced apart from the inner surface of the wall portion 12*d*.

Figure 3:
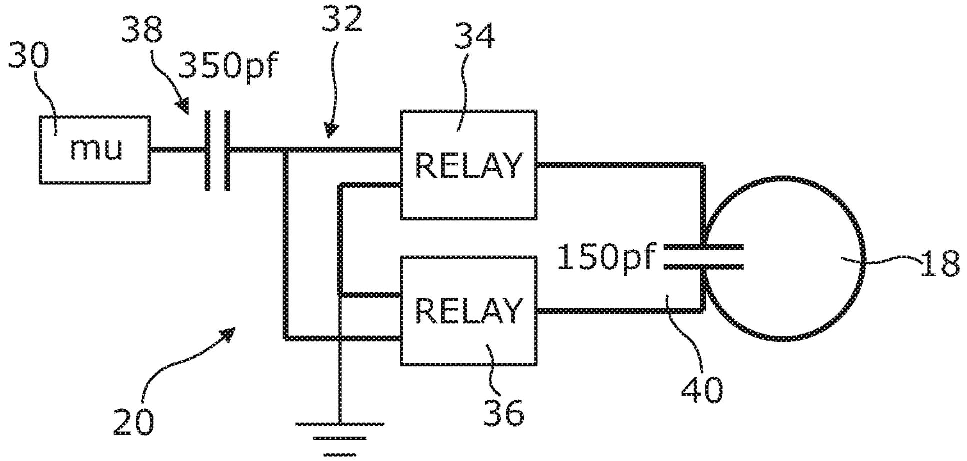
FIG. 3 shows a RF power supply including a switch for alternating the polarity of the applied RF voltage.

The RF power supply 20 supplies an RF power to the coil antenna 18 by applying a RF voltage which has an associated polarity. In accordance with the invention, the polarity is alternated at low frequency. The low frequency alternation can be 1000 Hz or less. FIG. 3 shows an arrangement which enables the polarity of the applied RF voltage to be switched at an appropriately low frequency. FIG. 3 shows the RF power supply 20 of FIG. 1 in more detail. The RF power supply 20 comprises a RF power source (not shown), a RF impedance matching unit 30 and associated RF antenna circuitry. The RF power source (not shown) supplies RF energy through impedance matching unit 30 which is coupled to the coil antenna 18 through a switch 32. The switch 32 comprises first and second relays 34, 36, and first and second capacitors 38, 40. Each relay 34, 36 has an input line which carries the high RF voltage and an input line which is earthed. Each relay has an output line which is connected to a different terminal of the second capacitor 40. The antenna coil 18 has two terminals which are also each in connection to a different terminal of the second capacitor 40. It will be appreciated that the relays 34, 36 can be readily controlled so as to apply the RF power to a desired terminal of the coil antenna and to hold the other terminal of the coil antenna at ground potential. It is also possible to readily alternate the polarity of the applied RF voltage between the two terminals of the coil antenna at a desired low frequency. It will also be appreciated that many other suitable switches for achieving this end result could be implemented by the skilled reader in a straightforward manner.

In a standard prior art ICP arrangement, the coil antenna is configured such that one terminal is earthed and the other is fed the RF power. This prior art way of driving an ICP coil antenna can be characterised as asymmetric. A consequence of supplying the RF power in an asymmetric fashion is that this asymmetry is also projected onto the plasma that is produced. In particular, the end of the coil which is at a high RF potential produces in its vicinity an energetic, "hot" plasma. Conversely, the end of the coil antenna which is earthed gives rise to a plasma which is less energetic and relatively "cold". The present inventors have conducted experiments using asymmetric prior art ICP plasma production techniques in combination with a slotted Faraday shield of the type generally shown in FIG. 2. It was found that the interior wall of the chamber in the vicinity of the "hot", energetic plasma (i.e., in the vicinity of the RF driven terminal of the coil antenna) was either substantially or completely free from deposition. In contrast, the interior wall of the chamber corresponding to the slots in the Faraday shield that were in the vicinity of the "cold", less energetic plasma (i.e., in the vicinity of the earthed terminal of the coil antenna) became coated with redeposited material. Without wishing to be bound by any particular theory or conjecture, it is believed that this is caused by the high voltage at one end of the coil antenna which enables a sputter-type ablation of the inside of the chamber wall by ion bombardment, i.e., by positively charged ions accelerated by strong electrical fields towards the wall of the chamber. No such mechanism exists at the ends of the earthed end of the coil antenna, and so material can build up on the interior wall in this region of the chamber. This can result in process problems such as loss of etch rate or a deterioration in etch uniformity due to a partial blocking of inductive coupling of RF power into the plasma. In addition, problems associated with the flaking of loosely adhered particulate material in this region may shorten the chamber maintenance interval. A further problem associated with the prior art technique is that driving the coil antenna asymmetrically produces a plasma that is shifted away from the centre of the chamber. This is manifest as an etch non-uniformity where the etch profile is not centred on the substrate.

The low frequency switching of the polarity taught by the present invention gives rise to a number of substantial advantages. By repeatedly driving the coil antenna using one polarity and the reverse polarity, an averaging effect is achieved with respect to the properties of the plasma. This centres the etch profile and improves etch uniformity. Experiments using 300 mm wafers have been performed to demonstrate these advantages in which low frequency switching of the polarity is performed. The results are compared to experiments in which etches were performed with the coil antenna only driven with one polarity and with the coil antenna only driven with the reverse polarity. The results are shown in Table one. This clearly demonstrates that etch uniformity is improved using the low frequency switching of the polarity whilst the etch rate is at least maintained.

TABLE 1

| | Etch Rate (A/min) | Non-uniformity (1 s %) |
|---|---|---|
| Coil Polarity 1 | 432 | 5.7 |
| Coil Polarity 2 | 435 | 7.1 |
| Combined Etch | 434 | 4.6 |

When the polarity is alternated in accordance with the invention, both ends of the coil antenna are alternately "hot". All points on the coil therefore experience the higher voltages which are necessary to produce a strong electric field which will facilitate sputter-type etching of the chamber by ion bombardment. It should be noted that this approach is fundamentally different to the prior art "balun" coil technique where the coil is connected to the balanced drive that operates at RF frequencies. In the case of the balun coil, a virtual ground is created and no ion etching of the chamber would occur in the vicinity of the virtual ground. With the balun technique, the switching is at very high frequency in the MHz range. At such high frequencies, the relative mobility of sputtering ions such as $Ar^+$ is relatively low which means that the bombardment of the chamber interior is much reduced. This would result in an undesirable build up of redeposited material on the chamber walls. The present invention utilises much lower switching frequencies. At these low frequencies, the ions present in the plasma are able to follow the electric field and sputter-type abrasion of the chamber walls is performed which results in effective cleaning.

The Faraday shield acts as a physical shield which protects at least part of the interior of the chamber from unwanted redeposition of material. In particular, the Faraday shield can act as a sputter shield which protects against redeposition of conductive material which would otherwise attenuate the inductive coupling between the coil antenna and the plasma. The Faraday shield may be sized and positioned to be sufficiently close to the wall of the chamber that no significant line of sight exists from the interior of the chamber to the wall of the chamber behind the Faraday shield. The slots in the Faraday shield can be formed of a sufficient length that they do not significantly impinge on the electric field generated by the coil antenna. This acts to minimise the effect of the Faraday shield on the etch process. It is preferred that the slots are vertically formed so that horizontal eddy currents are prevented from circulating within the chamber. Conveniently, the Faraday shield is grounded to the chamber to minimise sputtering onto the surface of the chamber during plasma processing. In addition to the physical shielding provided by the Faraday shield, a further advantage is that the Faraday shield is effective at blocking capacitive coupling into the plasma. Capacitive coupling can contribute to a non-uniform plasma density. It is desirable that any loss of inductively coupled RF is kept to a minimum, so that there are no problems associated with striking the plasma, process etch rate or non-uniformity.

As described above, the polarity of the coil antenna is switched at low frequency in such a way as to increase the time averaged electric field at all points whilst increasing the ion bombardment of the chamber walls through the slots formed in the Faraday shield. In this way, the portion of the interior walls of the chamber which are exposed by the apertures in the Faraday shield can be effectively sputter etched so that these exposed portions of the interior walls remain substantially free from redeposition of material, in particular redeposition of metallic material. It has been observed that the low frequency switching of the polarity in combination with the use of the Faraday shield gives rise to a particularly strong plasma glow in the apertures of the Faraday shield. This strong glow is essentially uniform as a function of position within the aperture. The strength of the plasma in the apertures has the effect that any deposited material on the walls of the chamber adjacent to the apertures is removed more effectively than if there were no Faraday shield in place. This at least partly compensates for the fact that the material can be sputtered onto the walls of the chamber through the apertures in the Faraday shield.

Marathon tests were performed on 300 mm wafers using an ICP sputter etch apparatus of the invention and using a prior art ICP sputter etch apparatus in which the coil antenna was driven with a single, unchanging polarity. Wafers having a 60% copper and 40% silicon dioxide surface area were etched. The ceramic portion of the chamber was inspected after each of the marathon tests. It was observed that when the coil is run prior art manner, with a single polarity, the ceramic was completely coated in redeposited material in a region close to the portion of the coil which is grounded. The area in which there was complete coating with redeposited material corresponds to approximately 17% of the total area of the ceramic portion. This redeposited material acts to block inductive coupling, allowing eddy currents to circulate, and is a potential source of particulate material which may drop onto the surface. In contrast, after marathon testing using the present invention, it was observed that the chamber ceramic was completely free from deposition at all points. This results in a stable, uniform etch that can be maintained over long periods.

Figure 4:
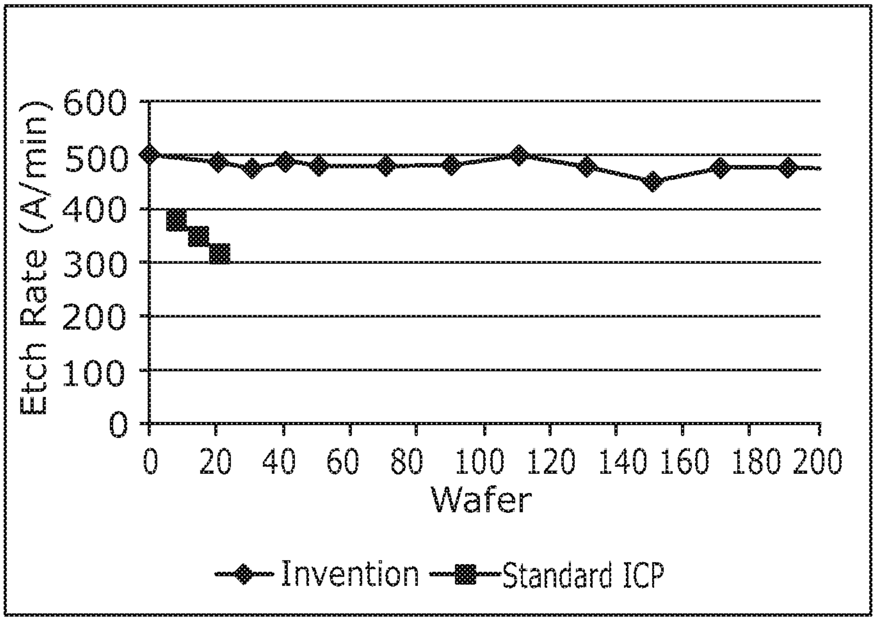
FIG. 4 shows etch rate of a marathon wafer etching process.
Figure 5:
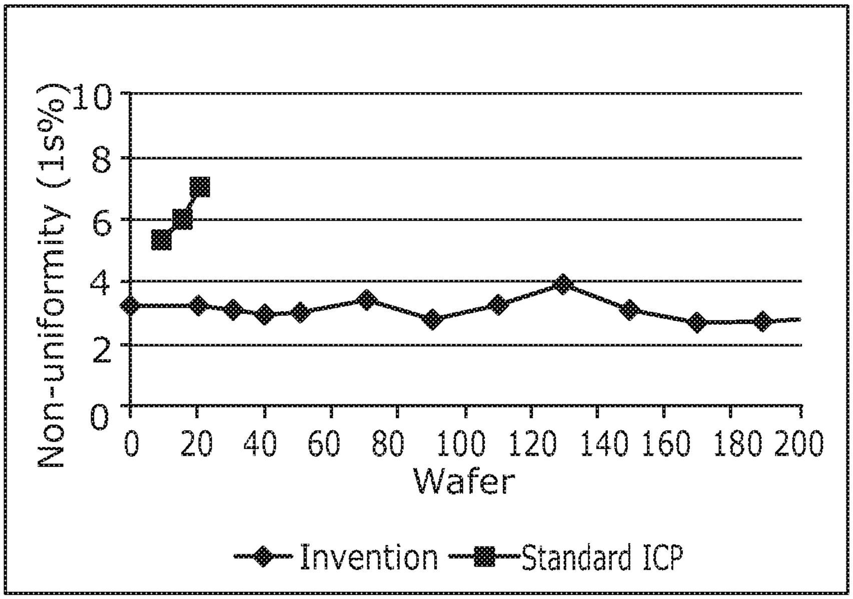
FIG. 5 shows etch non-uniformity over a marathon wafer etching process.

FIGS. 4 and 5 show quantitative results associated with the marathon tests. FIG. 4 shows the etch rate obtained as a function of increasing numbers of wafers etched. FIG. 5 shows etch non-uniformity as a function of increasing numbers of wafers etched. It was be seen that both the etch rate and the etch non-uniformities achieved using the present invention are remarkably superior to the prior art process. It can also be observed that only a limited number of wafer could be etched in a sequence using the prior art technique. This is because a maintenance procedure was required after 20 wafers were etched.

It is possible that a build up of redeposited material on the Faraday shield itself may become a potential source of problem particulates. This problem can be obviated or at least reduced by using a pasting technique to coat the cage with a low stress material having good adhesion. This would act to paste down any loose particulate material on the Faraday shield so the chamber maintenance can be extended.

What is claimed is:

1. A plasma producing apparatus for plasma processing a substrate comprising:

a chamber comprising an interior wall portion formed from an electrically insulating material, the interior wall portion having an interior surface and a lid portion disposed on the interior wall portion, wherein the chamber and the interior wall portion are cylindrical;

an inductively coupled plasma (ICP) source that concentrically surrounds the interior wall portion and produces a plasma within the chamber;

a substrate support disposed within the chamber and dedicated to support the substrate during plasma processing; and only one Faraday shield in the form of a cage comprising a body and a plurality of apertures extending therethrough that expose the interior wall portion to material removed from the substrate, wherein the Faraday shield is disposed within the chamber and facing at least part of the interior surface of the interior wall portion to shield the at least part of the interior surface from the material removed from the substrate by the plasma processing, wherein the body of the Faraday shield is in direct contact with and grounded to the lid portion that is exposed to the plasma in the chamber, and wherein the apertures are vertically aligned slots perpendicular to the ICP source;

in which the ICP source comprises an antenna having first and second ends and a radio frequency (RF) power supply coupled to the antenna, the RF power supply having an RF power source and circuitry configured to supply RF power to the antenna such that the RF power is automatically alternated during the plasma processing between first and second polarities at a frequency of less than or equal to 100 Hz and greater than or equal to 0.01 Hz and a plasma glow occurs in the apertures of the Faraday shield, wherein the antenna is a single turn coil, wherein the RF power in the first polarity includes an RF potential applied to the first end of the antenna, and the RF power in the second polarity includes the RF potential applied to the second end of the antenna.

2. A plasma producing apparatus according to claim 1 in which the antenna is horizontally disposed around the chamber.

3. A plasma producing apparatus according to claim 1 in which the circuitry of the RF power supply comprises a switch coupled to the RF power source and which causes the alternation of the polarity of the RF power supplied to the antenna.

4. A plasma producing apparatus according to claim 1 further comprising a substrate support electrical power supply operatively electrically connected to the substrate support to electrically bias the substrate support.

5. A plasma producing apparatus according to claim 4 in which the substrate support electrical power supply is an RF power supply for producing a RF bias on the substrate support.

6. A plasma producing apparatus according to claim 1 configured for sputter etching the substrate.

7. A plasma producing apparatus according to claim 6 configured for pre-cleaning the substrate.

8. A plasma producing apparatus according to claim 1 in which the RF power supply is configured to supply RF power to the antenna with a polarity which is alternated at a frequency of greater than or equal to 0.05 Hz.

9. A plasma producing apparatus according to claim 1 in which the RF power supply is configured to supply RF power to the antenna with a polarity which is alternated at a frequency of greater than or equal to 0.1 Hz.

10. A plasma producing apparatus according to claim 1 in which the RF power supply is configured to supply RF power supply supplies RF power to the antenna with a polarity which is alternated at a frequency of less than or equal to 25 Hz.

11. A plasma producing apparatus according to claim 1 in which the RF power supply is configured to supply RF power to the antenna with a polarity which is alternated at a frequency of less than or equal to 10 Hz.

12. A plasma producing apparatus according to claim 1 wherein the RF power in the first polarity further includes a ground potential applied to the second end of the antenna, and the RF power in the second polarity further includes the ground potential applied to the first end of the antenna.

13. A plasma producing apparatus according to claim 1, wherein the electrically insulating material is quartz.

14. A plasma producing apparatus according to claim 1, wherein the electrically insulating material is ceramic.

15. A plasma producing apparatus according to claim 1, wherein the apertures do not significantly impinge on the electric field generated by a coil of the antenna.

* * * * *